(12) United States Patent
Kabir et al.

(10) Patent No.: US 11,430,743 B1
(45) Date of Patent: Aug. 30, 2022

(54) TRANSISTOR WITH SHIELD SYSTEM INCLUDING MULTILAYER SHIELD STRUCTURE ARRANGEMENT

(71) Applicant: NXP USA, Inc., Austin, TX (US)

(72) Inventors: Humayun Kabir, Gilbert, AZ (US); Michele Lynn Miera, Gilbert, AZ (US); Charles John Lessard, Gilbert, AZ (US); Ibrahim Khalil, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/223,410

(22) Filed: Apr. 6, 2021

(51) Int. Cl.
*H01L 23/522* (2006.01)
*H01L 21/768* (2006.01)
*H01L 23/552* (2006.01)
*H01L 23/535* (2006.01)
*H01L 29/78* (2006.01)

(52) U.S. Cl.
CPC .......... *H01L 23/552* (2013.01); *H01L 21/768* (2013.01); *H01L 23/5225* (2013.01); *H01L 23/535* (2013.01); *H01L 29/78* (2013.01)

(58) Field of Classification Search
CPC ... H01L 29/78; H01L 23/5225; H01L 23/535; H01L 23/552; H01L 21/768
USPC ...................................................... 257/659
See application file for complete search history.

(56) References Cited

U.S. PATENT DOCUMENTS

| 9,653,410 | B1* | 5/2017 | Holmes ............... H01L 23/4824 |
| 10,147,686 | B1 | 12/2018 | Lessard et al. |
| 10,593,619 | B1 | 3/2020 | Khalil et al. |

OTHER PUBLICATIONS

U.S. Appl. No. 16/720,579, filed Dec. 19, 2019, Vikas Shilimkar et al, "Compact Transistor Utilizing Shield Structure Arrangement" 29 pages.

* cited by examiner

*Primary Examiner* — Monica D Harrison

(57) ABSTRACT

A transistor includes a semiconductor substrate having first and second terminals. An interconnect structure, on an upper surface of the substrate, is formed of layers of dielectric material and electrically conductive material. The conductive material includes a first pillar connected with the first terminal, a second pillar connected with the second terminal, and a shield system between the first and second pillars. The shield system includes forked structures formed in at least two conductive layers of the interconnect structure and at least partially surrounding segments of the second pillar. The shield system may additionally include shield traces formed in a first conductive layer positioned between gate fingers and the first pillars and/or the shield system may include shield runners that are located in an electrically conductive layer that is below a topmost electrically conductive layer with the first pillar being connected to a runner in the topmost conductive layer.

20 Claims, 10 Drawing Sheets

TRANSISTOR WITH SHIELD SYSTEM INCLUDING MULTILAYER SHIELD STRUCTURE ARRANGEMENT

TECHNICAL FIELD OF THE INVENTION

The present invention relates generally to field effect transistors. More specifically, the present invention relates to a field effect transistor design in a compact form factor having a multilayered shield structure between the input and output of the active device.

BACKGROUND OF THE INVENTION

A typical high power semiconductor device package may include one or more input leads, one or more output leads, one or more transistors, wirebonds coupling the input lead(s) to the transistor(s), and wirebonds coupling the transistor(s) to the output lead(s). A field effect transistor (FET) in such a high power semiconductor device package may include interdigitated drain and gate runners. The gate of the FET is driven by an input signal tapped from the gate runner. Miniaturization of integrated circuits is critical to enable compact circuit design, increase the quantity of IC dies per wafer, and thereby reduce the cost of such IC dies. However, compact circuit designs can increase electric coupling between, for example, the gate and drain runners of such integrated circuits. This electric coupling can add parasitic feedback capacitance that may reduce amplifier stability and reduce gain.

SUMMARY

Aspects of the disclosure are defined in the accompanying claims.

In a first aspect, there is provided a transistor comprising: a semiconductor substrate having a first terminal and a second terminal; and an interconnect structure on an upper surface of the semiconductor substrate, the interconnect structure being formed of multiple layers of dielectric material and electrically conductive material, the electrically conductive material of the interconnect structure comprising: a first pillar in electrical contact with the first terminal; a second pillar in electrical contact with the second terminal; and a shield system positioned between the first and second pillars, the shield system including a first forked structure formed in a first conductive layer of the electrically conductive material and at least partially surrounding a first segment of the second pillar, a second forked structure formed in a second conductive layer of the electrically conductive material overlying the first forked structure and at least partially surrounding a second segment of the second pillar, the first and second forked structures being electrically interconnected by a first conductive via extending through a first dielectric layer of the dielectric material formed between the first and second conductive layers.

In a second aspect, there is provided a method of manufacturing a transistor comprising: providing a semiconductor substrate having a first terminal and a second terminal; and forming an interconnect structure on an upper surface of the semiconductor substrate of multiple layers of dielectric material and electrically conductive material. The forming the interconnect structure comprises forming a first pillar from the electrically conductive material, the first pillar electrically contacting the first terminal; forming a second pillar from the electrically conductive material, the second pillar electrically contacting the second terminal; and forming a shield system between the first and second pillars, the shield system including a first forked structure formed in a first conductive layer of the electrically conductive material and partially at least surrounding a first segment of the second pillar, a second forked structure formed in a second conductive layer of the electrically conductive material overlying the first forked structure and at least partially surrounding a second segment of the second pillar, the first and second forked structures being electrically interconnected by a first conductive via extending through a first dielectric layer of the dielectric material formed between the first and second conductive layers.

In a third aspect, there is provided a transistor comprising: a semiconductor substrate having a first terminal and a second terminal; and an interconnect structure on an upper surface of the semiconductor substrate, the interconnect structure being formed of multiple layers of dielectric material and electrically conductive material. The electrically conductive material of the interconnect structure comprises: a first pillar in electrical contact with the first terminal; a second pillar in electrical contact with the second terminal; and a shield system positioned between the first and second pillars, the shield system including a first forked structure formed in a first conductive layer of the electrically conductive material and at least partially surrounding a first segment of the second pillar, a second forked structure formed in a second conductive layer of the electrically conductive material overlying the first forked structure and at least partially surrounding a second segment of the second pillar, the first and second forked structures being electrically interconnected by a first conductive via extending through a first dielectric layer of the dielectric material formed between the first and second conductive layers, wherein each of the first and second forked structures includes a base segment, a first leg, and a second leg, the first and second legs extending from opposing ends of the base segment in a direction that is antiparallel to a length of the base segment, wherein the base segment, first leg, and second leg of each of the first and second forked structures are arranged in a stacked relationship in a direction perpendicular to the upper surface of the semiconductor substrate. The transistor further comprises a first runner formed in a top conductive layer of the electrically conductive material and electrically connected to the first pillar, the top conductive layer residing farthest away from the upper surface of the semiconductor substrate relative to remaining conductive layers of the electrically conductive material; a second runner electrically connected to the second pillar; and a third runner interposed between the first and second runners, the third runner being electrically connected to the shield system, wherein the second and third runners are formed in a next conductive layer of the electrically conductive material, the next conductive layer underlies the top conductive layer, and another dielectric layer extends between the top and the next conductive layers.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Figure 1:
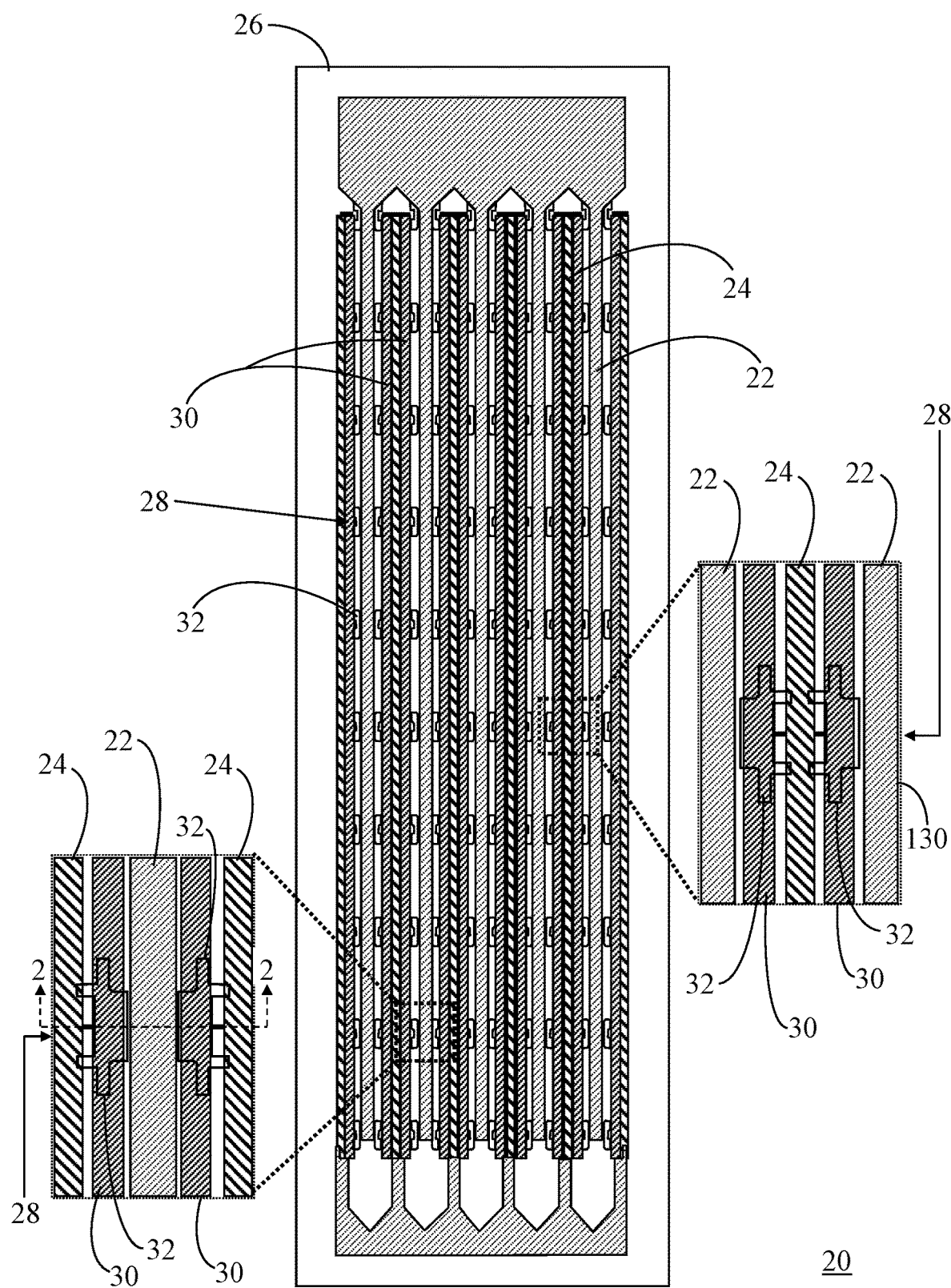
FIG. 1 shows a simplified plan view of an example of a transistor having interdigitated drain and gate runners.

In overview, embodiments disclosed herein entail a transistor in a compact form factor having a shield system that includes multilayer shield structures within an interconnect structure of the transistor. More specifically, embodiments can include multiple shield structures strategically located along the runners of a multiple runner interdigitated transistor near positions where the input interconnections approach the output interconnections (tap locations). Each shield structure includes two or more stacked structures, each having an approximately U-shaped or forked geometry, that are formed in at least two layers of electrically conductive material. The stacked structures are interconnected by electrically conductive vias, and connect to overlying shield runners by electrically conductive vias. The shield runners and gate runners of the transistor may be positioned in an electrically conductive layer below a topmost electrically conductive layer of the interconnect structure and the drain runners may be positioned in the topmost electrically conductive layer for a tight pitch transistor. Additionally, the shield system can include shield traces that are positioned between the gate fingers and the drain of the transistor. The shield traces may be longitudinally aligned with the length of the gate fingers. The geometry of the shield system may enable a reduction in electric coupling between the gate and drain features of the transistor to effectively increase the gain of the active device (e.g., transistor) without degrading device stability. Further, the geometry of the stacked shield structures and their location at the tap locations can enable a compact and highly integrated system design.

The following description entails the implementation of a shield system within an interconnect structure of a field effect transistor (FET) in a non-limiting fashion. Multiple shield structures of the shield system may be strategically located along the gate runner of a multiple runner interdigitated FET and extending through the interconnect structure near positions where the input connections from a gate runner approach the output interconnections to a drain runner. Additionally, multiple shield traces of the shield system may be strategically positioned in the first conductive layer of the interconnect structure between the drain pillars and the gate fingers of an interdigitated FET. It should be understood, however, that the shield system may be implemented within a wide variety of unipolar and bipolar transistor technologies.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

FIG. 1 shows a simplified plan view of an example of a transistor 20 having interdigitated drain and gate runners 22, 24, respectively. That is, drain runners 22 and gate runners 24 are closely positioned relative to one another in an alternating arrangement. Gates (not visible) generally surround drain regions (not visible) formed within a semiconductor substrate 26 of an intrinsic device underlying drain and gate runners 22, 24. Transistor 20 further includes a plurality of tap interconnects (not visible) formed from electrically conductive material, typically metal. The tap interconnects are electrically connected between gate runners 24 and gate taps or gate electrodes of the gates formed within semiconductor substrate 26. The positions at which the tap interconnects are located are referred to herein as tap locations 28. Transistor 20 may further include shield runners 30 interposed between each pair of drain and gate runners 22, 24, and a shield system 32 that may be electrically connected to shield runners 30. The interdigitated drain, gate, and shield runners 22, 24, 30 may be formed in one or more metal layers (referred to herein as an interconnect structure) above semiconductor substrate 26.

The shading utilized in FIG. 1 is provided to distinguish the interdigitated drain, gate, and shield runners 22, 24, 30 from one another. The same shading may or may not be utilized in subsequent illustrations. Additionally, shield system 32 is illustrated with a solid line pattern to demonstrate it's position at tap locations 28. In general, elements of shield system 32 (discussed below) may underlie other structures such as gate runners 22 and shield runners 30 and would therefore not be visible.

Shield system 32 includes a multilayer stacked arrangement of shield structure elements (discussed below) that are suitably located at tap locations 28 and are configured to reduce electric coupling between drain and gate runners 22, 24. In some embodiments, shield system 32 may further include shield traces (also discussed below) positioned between drain pillars and gate fingers of an interdigitated FET to further reduce electrical coupling between the drain and gate features of transistor 20.

Figure 2:
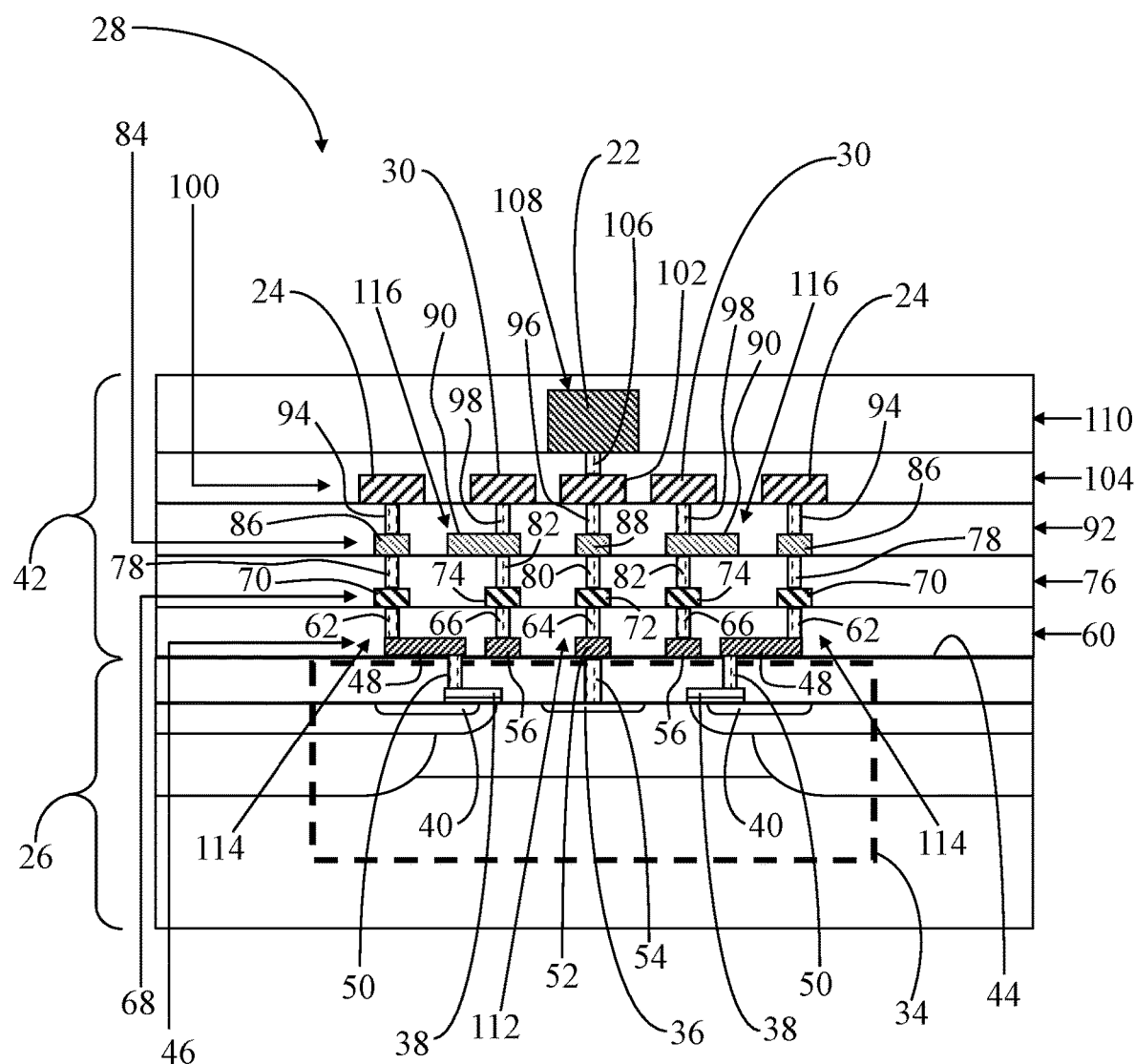
FIG. 2 shows a side sectional view of a portion of the transistor along section line 2-2 of FIG. 1 in accordance with an embodiment.

Referring now to FIG. 2, FIG. 2 shows a side sectional view of a portion of transistor 20 along section line 2-2 of an enlarged portion of FIG. 1 at one of tap locations 28 in accordance with an embodiment. Transistor 20 includes an intrinsic active device, e.g., a FET 34 (represented generally by a dashed line box), formed in semiconductor substrate 26. FET 34 within semiconductor substrate 26 includes, among other features, a first terminal, referred to herein as a drain region 36 and a second terminal, referred to herein as gate electrodes 38. Gate electrodes 38 (also simply referred to as gates) are electrically coupled to gate regions 40 (sometimes referred to as channels) of FET 34. Further details of FET 34 are known to those skilled in the art and are therefore not described herein for brevity. It bears repeating that although a FET design is discussed herein, a wide variety of unipolar and bipolar transistor technologies may alternatively be implemented.

An interconnect structure 42 is formed on an upper surface 44 of semiconductor substrate 26. As discussed above, interconnect structure 42 of transistor 20 includes a plurality of interdigitated first and second runners, e.g., drain and gate runners 22, 24. Additionally, interconnect structure 42 includes shield runners 30 interposed between each drain and gate runner 22, 24. Only a single drain runner 22, two gate runners 24, and two shield runners 30 are shown in the side sectional view of FIG. 2 for simplicity of illustration. However, transistor 20 may be configured to include the multiplicity of drain, gate, and shield runners 22, 24, 30 shown in FIG. 1. Additionally, gate electrodes 38 may be structured on opposing sides of drain runners 22.

Interconnect structure 42 may be formed of multiple layers of dielectric material and electrically conductive material. In the illustrated configuration, interconnect structure 42 includes five layers of electrically conductive material (sometimes referred to as metal layers, M1-M5, with M1 being closest to upper surface 44 of substrate 26), spaced apart by layers of dielectric material. A first conductive layer 46 (represented by dark upward and rightward directed narrow hatching) is suitably formed on upper surface 44 of semiconductor substrate 26 to include tap interconnect segments 48 (two shown) electrically connected to gate electrodes 38 by way of electrically conductive vias 50, drain segments 52 (one shown) electrically connected to drain region 36 by way of an electrically conductive via 54, and first shield structure elements 56 (two shown) interposed between tap interconnect segments 48 and drain segments 52. Additionally, a ground plane 58 (see FIG. 3) is formed in first conductive layer 46 on upper surface 44. Ground plane 58 will be described in greater detail below. Of course, other structures may additionally be formed on upper surface 44 of semiconductor substrate 26 that are not illustrated herein for simplicity.

A first dielectric material layer 60 is formed over tap interconnect segments 48, drain segment 36, and first shield structure elements 56 of first conductive layer 46. Electrically conductive vias 62, 64, 66 may be suitably formed extending through first dielectric material layer 60. By way of example, electrically conductive vias 62 extend through first dielectric material layer 60 and are in electrical contact with each of tap interconnect segments 48. Likewise, electrically conductive via 64 extends through first dielectric layer 60 and is in electrical contact with drain segment 36. Electrically conductive vias 66 extend through first dielectric layer 60 and are in electrical contact with first shield structure elements 56.

A second electrically conductive layer 68 (represented by downward and rightward directed wide hatching) is suitably formed on first dielectric material layer 60. Second electrically conductive layer 68 includes tap interconnect segments 70 in electrical contact with conductive vias 62. Second electrically conductive layer 68 further includes a drain segment 72 in electrical contact with conductive via 64. Still further, second electrically conductive layer 68 includes second shield structure elements 74 interposed between tap interconnect segments 70 and drain segment 72.

A second dielectric material layer 76 is formed over tap interconnect segments 70, drain segment 72, and first shield structure elements 56 of second electrically conductive layer 68. Electrically conductive vias 78, 80, 82 may be suitably formed extending through second dielectric material layer 76. By way of example, electrically conductive vias 78 extend through second dielectric material layer 76 and are in electrical contact with tap interconnect segments 70. Electrically conductive via 80 extends through second dielectric material layer 76 and is in electrical contact with drain segment 72. Electrically conductive vias 80 extend through second dielectric material layer 76 and are in electrical contact with shield structures second shield structure elements 74.

A third electrically conductive layer 84 (represented by light downward and rightward directed narrow hatching) is formed on second dielectric material layer 76. Third electrically conductive layer 84 includes tap interconnect segments 86 in electrical contact with conductive vias 78. Third electrically conductive layer 84 further includes a drain segment 88 in electrical contact with conductive via 80. Still further, third electrically conductive layer 84 includes third shield structure elements 90 interposed between tap interconnect segments 86 and drain segment 88.

A third dielectric material layer 92 is formed over tap interconnect segments 86, drain segment 88, and third shield structure elements 90 of third electrically conductive layer 84. Electrically conductive vias 94, 96, 98 are formed extending through third dielectric material layer 92. By way of example, electrically conductive vias 94 extend through third dielectric material layer 92 and are in electrical contact with tap interconnect segments 86. Electrically conductive via 96 extends through third dielectric material layer 92 and is in electrical contact with drain segment 88. Electrically conductive contacts 98 extend through third dielectric material layer 92 and are in electrical contact with third shield structure elements 90.

A fourth electrically conductive layer 100 (represented by upward and rightward directed wide hatching) is formed on third dielectric material layer 92. In this example, fourth electrically conductive layer 100 includes gate runners 24 in electrical contact with conductive vias 94 and shield runners 30 in electrical contact with conductive vias 98. Fourth electrically conductive layer 100 further includes drain strips 102 in electrical contact with conductive vias 96.

A fourth dielectric material layer 104 is formed over gate runners 24, shield runners 30, and drain strips 102 of fourth electrically conductive layer 100. An electrically conductive via 106 is formed extending through fourth dielectric material layer 104 and is in electrical contact with drain strip 102.

A fifth electrically conductive layer 108 (represented by dark downward and rightward directed narrow hatching is formed on fourth dielectric material layer 104. Fifth electrically conductive layer 108 includes drain runner 22 in electrical contact with conductive via 106. A fifth dielectric material layer 110 may be formed over fifth electrically conductive layer 108 to encapsulate drain runner 22.

Collectively, drain segments 52, 72, 88 and the intervening conductive vias 64, 80, 96 yield first pillars (referred to herein as drain pillars 112) for transistor 20 that electrically interconnect drain region 36 of intrinsic FET 34 to drain strip 102, with drain strip 102 and conductive via 106 forming the electrical interconnection between drain pillar 112 and drain runner 22. Tap interconnect segments 48, 70, 86 and the intervening conductive vias 62, 78, 94 yield second pillars (referred to herein as tap interconnects 114) between vias 50/gate electrodes 38 and gate runners 24. Additionally, first, second, and third shield structure elements 56, 74, 90, and the intervening conductive vias 66, 82, 98 yield third pillars (referred to herein as multilayer stacked shield structures 116) of shield system 32 (FIG. 1) at each tap location 28 between tap interconnects 114 and drain pillars 112, with multilayer stacked shield structures 116 being are electrically connected to shield runners 30.

Figure 5:
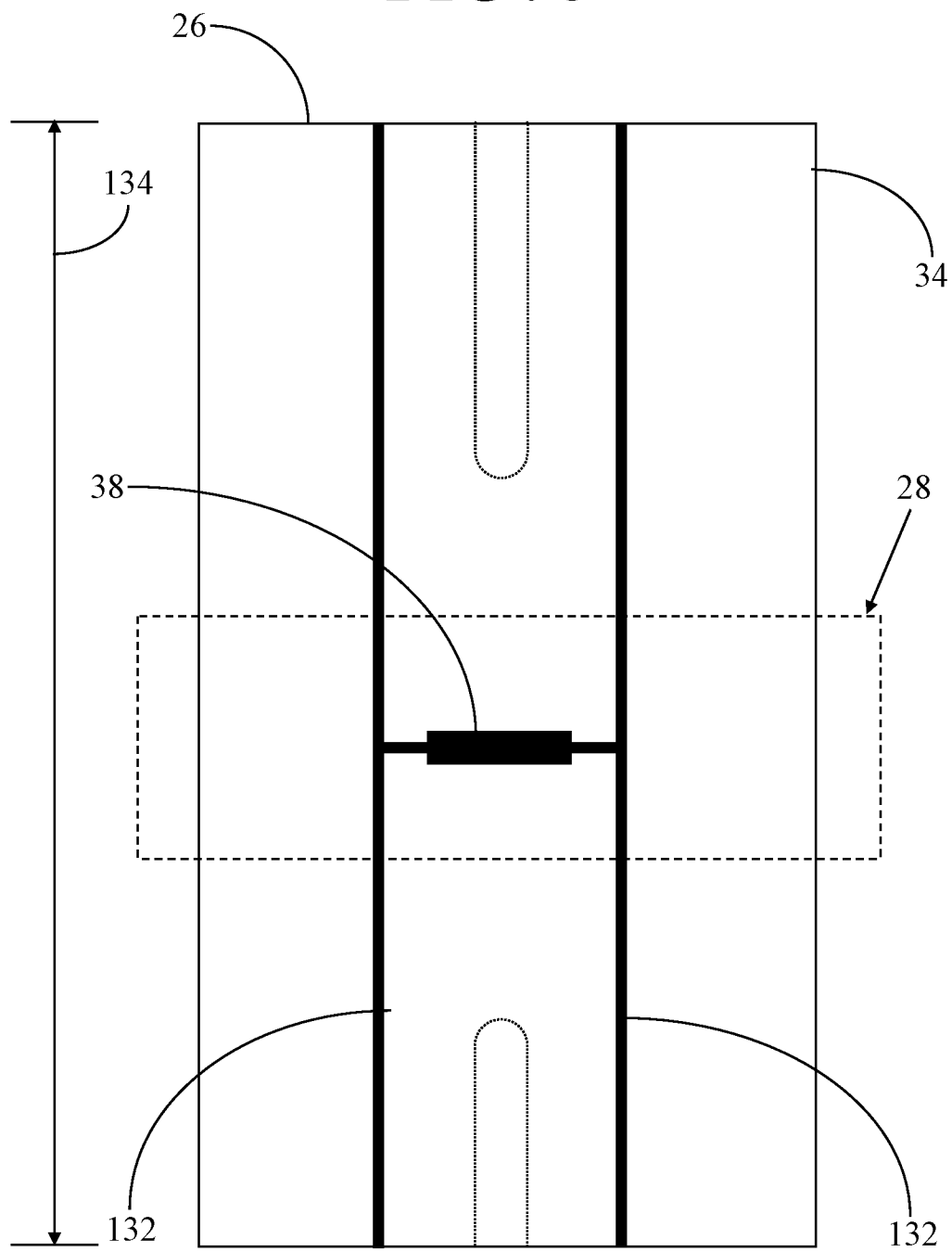
FIG. 5 shows a plan view of a portion of the transistor of FIG. 2 at an initial stage of processing to form an interconnect structure of the transistor.

Further, first runners (e.g., drain runners 22) are formed in the top conductive layer (e.g., fifth conductive layer 108) and second and third runners (e.g., gate and shield runners 24, 30) are formed in the next conductive layer underlying the top conductive layer (e.g., fourth conductive layer 100). Only one drain pillar 112, two tap interconnects 114, and two multilayer stacked shield structures 116 are illustrated in FIG. 2 for clarity. However, it should be understood that transistor 20 may include a multicity of drain pillars 112, tap interconnects 114, and multilayer stacked shield structures 116 in accordance with a configuration of interdigitated drain and gate runners 22, 24 like that shown in FIG. 1. Additionally, in tight pitch structures, gate electrodes 38 from neighboring intrinsic FET devices 34 (e.g., to the left of the illustrated left tap interconnect 114 and to the right of the illustrated right tap interconnect 114) may meet together as shown in FIG. 5.

In general, gate electrodes 38 of intrinsic FET 34 are driven by an input signal tapped from gate runners 24 via tap interconnects 114 to gate electrodes 38 at tap locations 28. Thus, tap locations 28 are the positions where tap interconnects 114 approach drain pillars 112 within interconnect structure 42. The potential for undesirable electrical coupling between the output metallization (i.e., drain pillars 112) and the input metallization (i.e., tap interconnects 114) is greatest at tap locations 28. Electrical coupling is defined herein as the energy stored in electric field lines between coupled electrodes. In circuit theory, it is manifested as a capacitance between two nodes in the circuit. For example, due to the electrical coupling, the input signal tapped from gate runners 24 can add parasitic feedback capacitance to an output signal from drain runner 22. Thus, electrical coupling can reduce amplifier stability and reduce gain. Further, this electrical coupling may be exacerbated in the compact form factor required for miniaturized transistors.

In accordance with an embodiment, multilayer stacked shield structures 116 (as the third pillars) of shield system 32 (FIG. 1) are interposed between tap interconnects 114 and drain pillars 112 and further between gate and drain runners 24, 22, which may enable effective shielding between the input and output structures at tap locations 28. Active devices used in, for example, RF power amplifier applications, suffer from parasitic terminal capacitances that act to reduce RF bandwidth, degrade stability, and reduce gain. The inclusion of multilayer stacked shield structures 116 of shield system 32 described in detail below are strategically located along the gate finger of a multi-finger interdigitated transistor near positions where the input interconnections approach the output interconnections (e.g., at tap locations 28). Multilayer stacked shield structures 116 can reduce an amount of feedback capacitance of the active intrinsic device (FET 34), effectively increasing amplifier gain without degrading amplifier stability.

As illustrated above, interconnect structure 42 of transistor 20 includes five electrically conductive (e.g., metal) layers, with first conductive layer 46 residing closest to upper surface 44 of substrate 26 relative to the remaining second, third, fourth, and fifth conductive layers 68, 84, 100, 108 and fifth conductive layer 108 residing farthest away from upper surface 44 of substrate 46 relative to the remaining conductive layers 46, 68, 84, 100. Drain runners 22 are formed in fifth conductive layer 108 and gate and shield runners 24, 30 are formed in fourth conductive layer 100. A five metal layer implementation versus implementations with a lower quantity of metal layers may be beneficial for enabling the tight pitch requirements of compact transistor technologies. It should be understood however that multilayer stacked shield structures 116 of shield system 32 may alternatively be implemented for technologies with less than or more than five metal layers.

Figure 3:
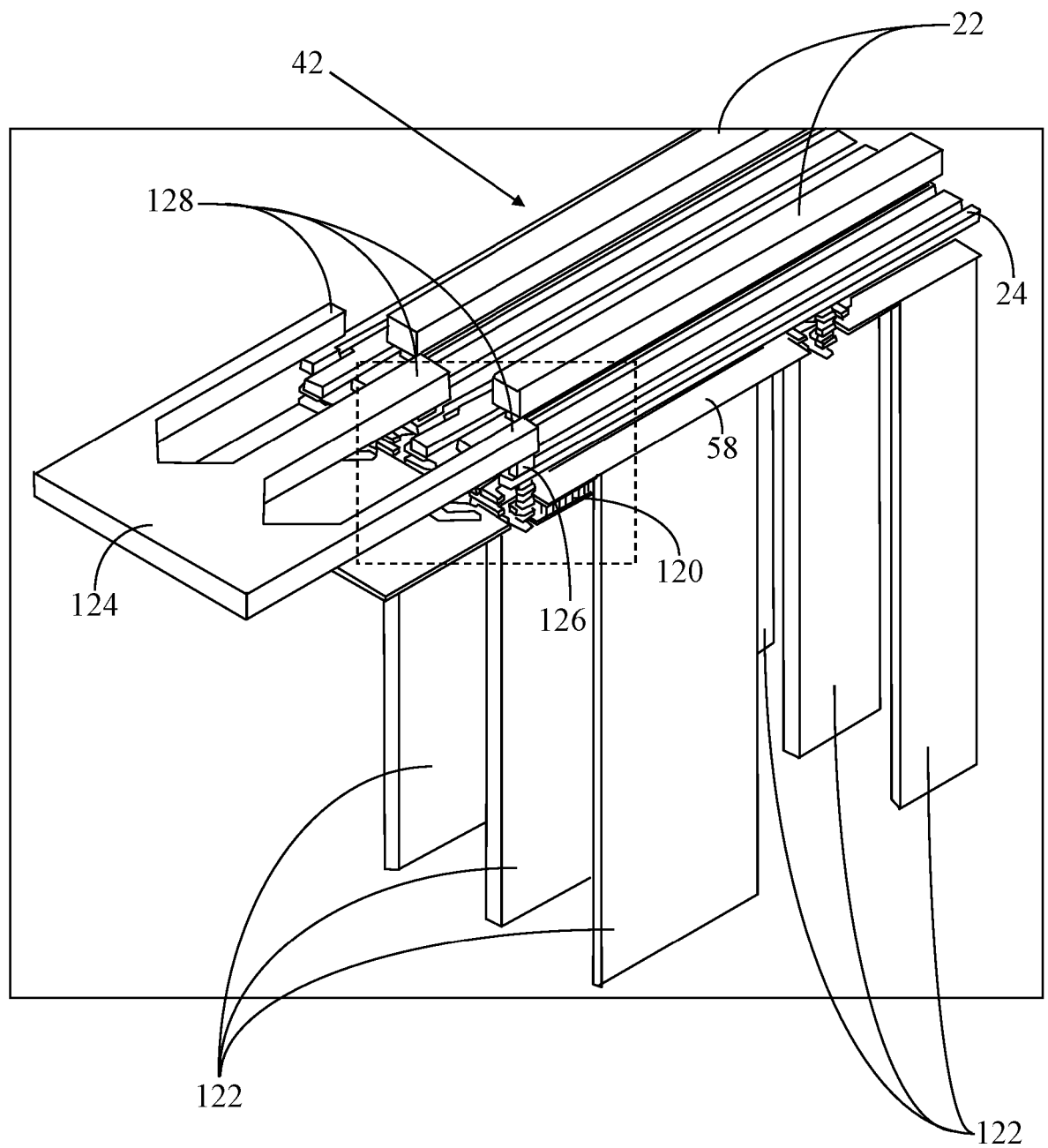
FIG. 3 shows a perspective view of a portion of the transistor.
Figure 4:
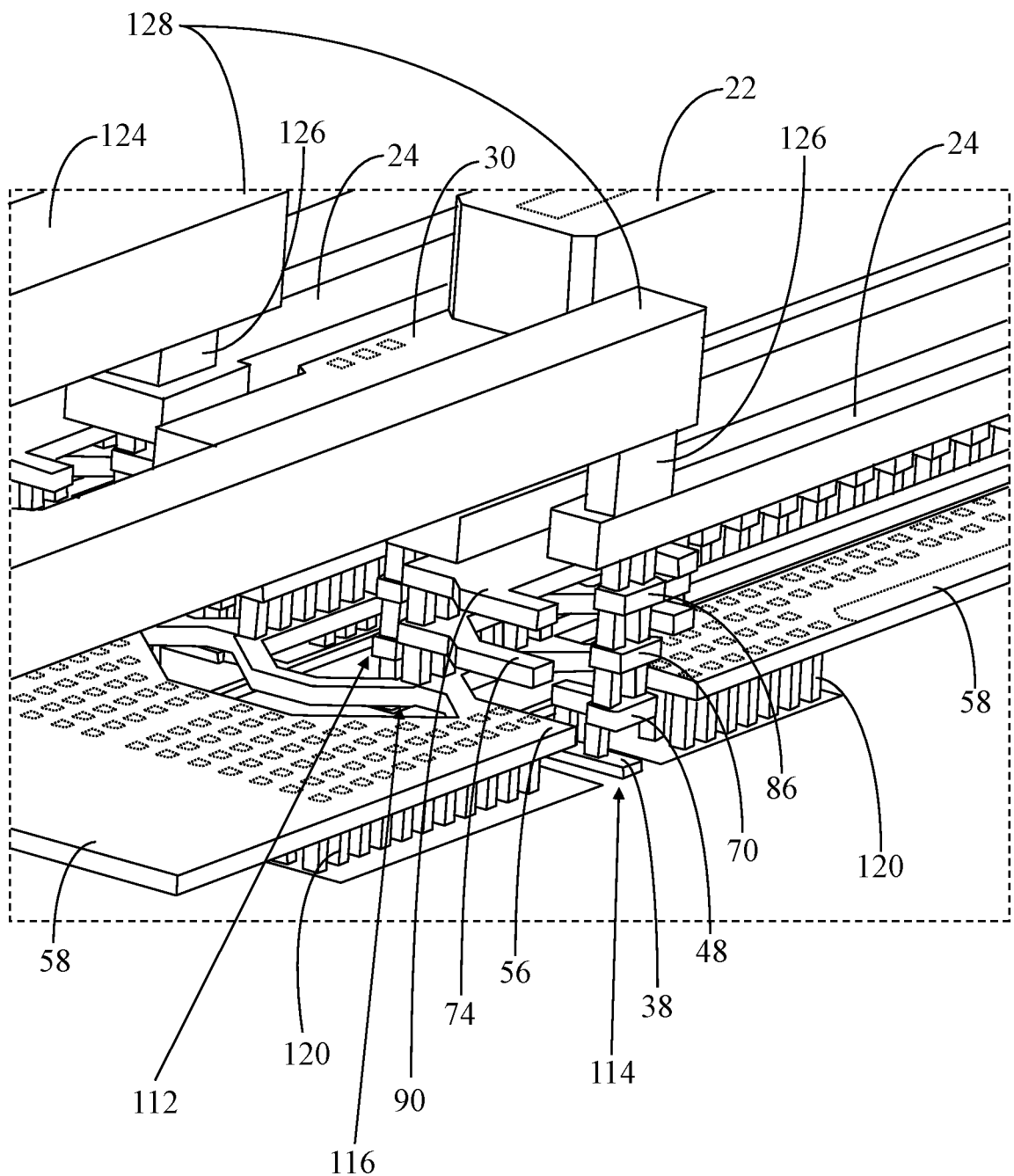
FIG. 4 shows an enlarged perspective view of a portion of the transistor delineated by a dashed line box in FIG. 3.

Referring now to FIGS. 3 and 4, FIG. 3 shows a perspective view of a portion of transistor 20 and FIG. 4 shows an enlarged perspective view of a portion of transistor 20 delineated by a dashed line box in FIG. 3. FIGS. 3 and 4 are provided without the underlying semiconductor substrate 26 (FIG. 2) and without the intervening dielectric material layers 60, 76, 92, 104, 110 (FIG. 2) to more clearly visualize the various metal layers within interconnect structure 42, as well as to more clearly visualize contact plugs 120 that interconnect ground plane 58 to the bottom of semiconductor substrate 26 by way of electrically conductive vias 122 extending through substrate 26.

FIGS. 3 and 4 show a gate manifold structure 124 interconnected to gate runners 24 by way of conductive vias 126 for providing an input signal to gate runners 24 and hence to gate electrodes 38 via tap interconnects 114. In this illustration, gate manifold structure 124 may be formed in fifth electrically conductive layer 108 along with drain runners 22. However, gate manifold structure 124 has manifold ends 128 that do not extend over the length of gate runners 24 so that gate manifold structure 124 is not located between drain runners. Such a design may be useful in accommodating the space constraints of miniaturized transistors, such as transistor 20.

Also visible (more clearly in FIG. 4) is drain pillar 112 and multilayer stacked shield structure 116 interposed between tap interconnects 114 and drain pillar 112. As will be discussed in significantly greater detail below, each of first, second, and third shield structure elements 56, 74, 90 of shield system 32 (FIG. 1) are U-shaped or forked structures that at least partially surround corresponding tap interconnect segments 48, 70, 86 of tap interconnects 114. In addition, shield system 32 may include shield traces positioned between drain pillars 112 and gate fingers (discussed below).

In FIG. 4 and subsequent illustrations, dotted line boxes present on some of the structures indicate locations of at least some of the underlying conductive vias 62, 64, 66, 78, 80, 82, 94, 96, 98, 106, 122, 126 and/or contact plugs 120. Such dotted line boxes will be provided on at least some of the illustrations, as needed, to highlight some of the electrical interconnections between electrically conductive layers of interconnect structure 42 and/or through semiconductor substrate 26.

FIG. 5 shows a plan view of a portion of transistor 20 (FIG. 1) at an initial stage of processing to form interconnect structure 42 (FIG. 2). More particularly, FIG. 5 represents a plan view of the enlarged portion of transistor 20 surrounded by a dotted line box 130 on the right side of the sheet on which FIG. 1 is presented. FIG. 5 and subsequent FIGS. 6-10 are illustrated with various dielectric material layers removed to reveal the various electrically conductive layers. As shown in FIG. 5, gate electrodes 38 from neighboring transistors (e.g., intrinsic active devices 34, FIG. 2) may be contact in tight pitch structures. However, for wider pitch structures, gate electrodes from the neighboring transistors may be separate.

In this example, the second terminal further includes a signal bus, referred to herein as gate fingers 132. Thus, gate fingers 132 together with gate electrodes 38 form the second terminal or gate (e.g., an input) for transistor 20. Gate fingers 132 are formed in substrate 26 and gate electrodes 38 are located at tap locations 28 (denoted by a dashed line box) along gate fingers 132. Gate fingers 132 are characterized by a length 134 that is considerably longer than that shown in FIG. 5. Thus, length 134 is represented by a bi-directional arrow. For example, length 134 of gate fingers 132 may be at least as long as gate runners 24 of transistor 20 illustrated in FIG. 1. Additionally, a multiplicity of gate electrodes 38 may extend from gate fingers 132 at a multiplicity of tap locations 28 as shown in FIG. 1. Of course, the remaining features (not shown for simplicity) of intrinsic FET 34 have also been formed in substrate 26. Thus, FIG. 5 represents a condition in which the electrically conductive and dielectric layers of interconnect structure 42 have not yet been formed over intrinsic FET 34.

Figure 6:
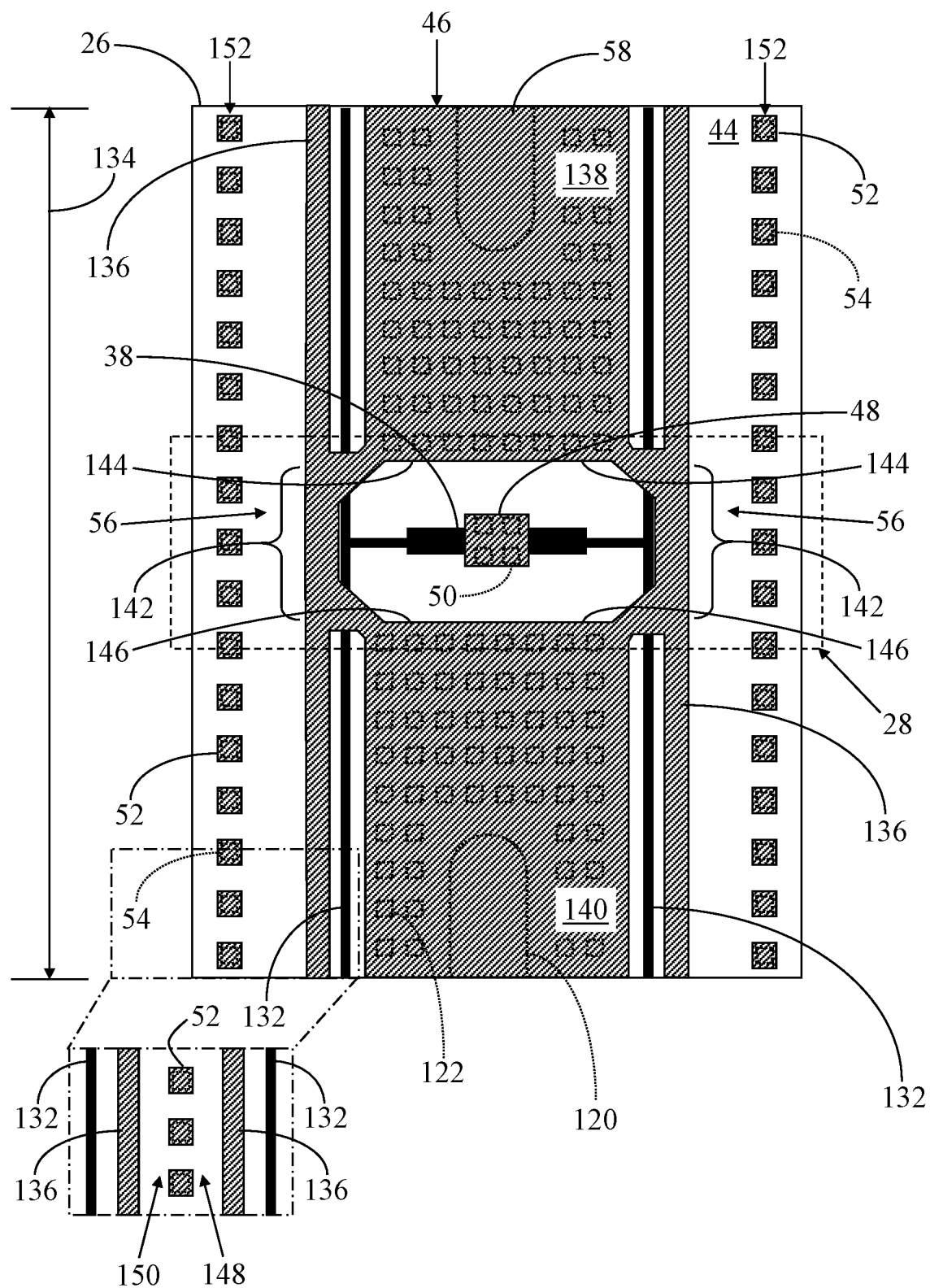
FIG. 6 shows a plan view of the portion of the transistor of FIG. 5 at a subsequent stage of processing to form the interconnect structure.

FIG. 6 shows a plan view of the portion of transistor 20 of FIG. 5 at a subsequent stage of processing to form interconnect structure 42 (FIG. 2). In this example, first conductive layer 46 (represented by dark rightward and upward narrow hatching) has been formed on upper surface 44 of semiconductor substrate 26. For example, an electrically conductive material such as a metal layer may be deposited, patterned, and etched to yield the desired structures (e.g., tap interconnect segments 48, drain segments 52, first shield structure elements 56, ground plane 58, and shield traces 136). Tap interconnect segments 48 may be coupled to the underlying gate electrodes 38 utilizing conductive vias 50 and drain segments 52 may be coupled to the underlying drain region 36 (FIG. 2) utilizing conductive vias 54. Ground plane 58 may be coupled directly to the underlying conductive vias 122 (FIG. 3) extending through substrate 26 and/or to vias 122 by way of contact plugs 120.

Tap interconnect segments 48 are laterally spaced apart from and therefore electrically isolated from the surrounding material of first conductive layer 46. This surrounding material includes first shield structure elements 56 and ground plane 58. In an illustrative example, ground plane 58 includes a first section 138 and a second section 140. Tap interconnect segments 48 may be formed in the spaces between adjacent sections 138, 140 of ground plane 58.

First shield structure elements 56 in first conductive layer 46 may be coupled to one another and/or to ground plane 58. First shield structure elements 56 may be considered to have a forked configuration that includes a base segment 142, a first leg 144, and a second leg 146 in which first and second legs 144, 146 extend from opposing ends of base segment 142 in a direction that is antiparallel (e.g., not aligned with) a length of base segment 142. Thus, first shield structure element 56 at least partially surrounds a first segment of the second pillar, e.g., tap interconnect segment 48 of tap interconnect 114 (FIG. 2). Additionally, first shield structure elements 56 partially overlap gate fingers 132 at tap locations 28. More particularly, portions of first and second legs 144, 146 overlap gate fingers 132. First shield structure elements 56 in first conductive layer 46 may alternatively be referred to herein as first forked structures 56.

In accordance with some embodiments, shield system 32 further includes shield traces 136 formed in first conductive layer 46 and longitudinally aligned with length 134 of gate fingers 132. Shield traces 136 are electrically connected to ground plane 58 in first conductive layer 46. As simplistically presented in an expanded view denoted by a dash-dot box in FIG. 6, one of shield traces 136 is positioned between one of gate fingers 132 and a first side 148 of drain segments 52. Another one of shield traces 136 is positioned between another one of gate fingers 132 and a second side 150 of drain segments 52. Although individual shield traces 136 are discussed herein on opposing sides 148, 150 of segments 52 of one row 152 of drain segments 52 of drain pillars 112 (FIG. 2), shield system 32 can include a multiplicity of shield traces 136 corresponding to the quantity of gate fingers 132 of gate regions 40 (FIG. 2) and the quantity of rows 152 of drain segments 52 of drain pillars 112 of transistor 20.

First forked structures 56 and shield traces 136 formed in first conductive layer 46 may effectively block an electric field between gate fingers 132 and drain segments 52 to reduce feedback capacitance, Co, between the input to gate region 40 (e.g., tap interconnect segments 48) and the output from drain region 36 (FIG. 2), e.g., drain segments 52. This reduction in feedback capacitance may be effective even though first and second legs 144, 146 minimally overlap gate fingers 132 at tap locations 28.

Figure 7:
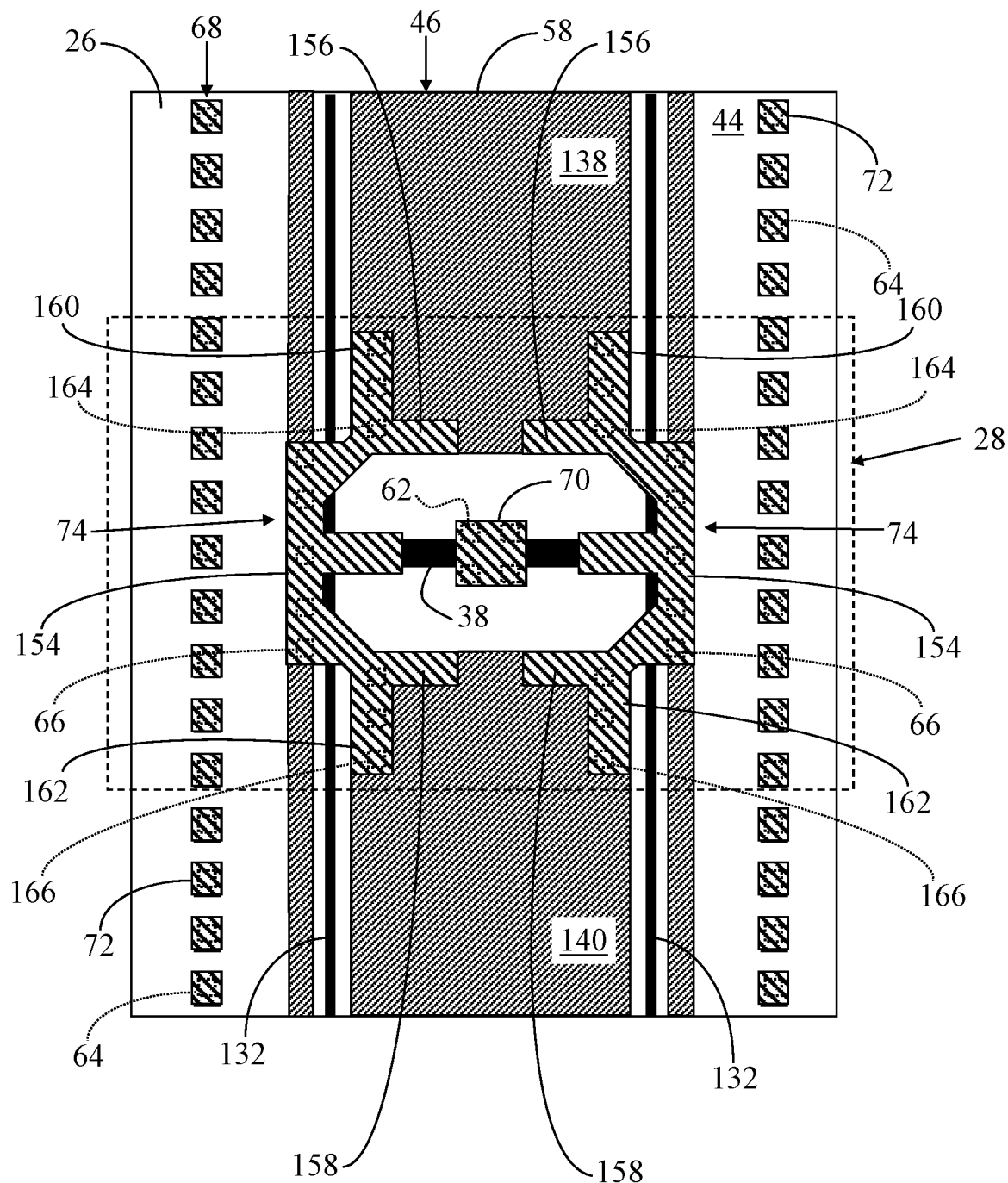
FIG. 7 shows a plan view of the portion of the transistor of FIG. 6 at a subsequent stage of processing to form the interconnect structure.

FIG. 7 shows a plan view of the portion of the transistor of FIG. 6 at a subsequent stage of processing to form interconnect structure 42 (FIG. 2). In this example, second conductive layer 68 (represented by rightward and downward wide hatching) has been formed on first dielectric material layer 60 (FIG. 2). For clarity, first dielectric material layer 60 is not shown in FIG. 7 in order to visualize the stacked relationship of structures within first and second conductive layers 46, 68. Again, an electrically conductive material such as a metal layer may be deposited, patterned, and etched to yield the desired structures (e.g., tap interconnect segments 70, drain segments 72, and second shield structure elements 74). Tap interconnect segments 70 may be coupled to the underlying tap interconnect segments 48 (FIG. 6) utilizing conductive vias 62, drain segments 72 may be coupled to the underlying drain segments 52 (FIG. 6) utilizing conductive vias 64, and second shield structure elements 74 may be coupled to the underlying first shield structure elements 56 (FIG. 6) utilizing conductive vias 66.

Second shield structure elements 74, formed in second conductive layer 68, include a base segment 154, a first leg 156, and a second leg 158 in which first and second legs 156, 158 extend from opposing ends of base segment 154 in a direction that is antiparallel to a length of base segment 154. That is, all of base segment 154, first leg 156, and second leg 158 are formed in second conductive layer 68 to yield a structure having an approximately U-shaped or forked geometry. Thus, second shield structure elements 74 may alternatively be referred to herein as second forked structures 74.

In general, base segments 142 of first forked structures 56 (FIG. 6) and base segments 154 of second forked structures 74 are electrically interconnected utilizing conductive vias 66. Further, base segment 142, first leg 144, and second leg 148 (FIG. 6) of first forked structure 56 are arranged in a stacked relationship with corresponding base segment 154, first leg 156, and second leg 158 of second forked structure 74 in a direction perpendicular to upper surface (FIG. 2) of semiconductor substrate 26. As such, first and second forked structures 56, 74 are generally vertically aligned relative to one another within interconnect structure 42 (FIG. 2) to yield reductions in electric coupling, while concurrently fitting within the size constraints of a compact transistor configuration.

In accordance with some embodiments, tap interconnect segment 70 formed in second conductive layer 68 of tap interconnect 114 (FIG. 2) resides between first and second legs 156, 158 of second forked structure 74 also formed in second conductive layer 68. The position of tap interconnect segment 70 at least partially surrounded by first and second legs 156, 158 of second forked structure 74 may effectively insulate tap interconnect segment 70 to further reduce electric field coupling from drain runner 22 (FIG. 1) to tap interconnect segment 70.

It should be recalled that first and second sections 138, 140 of ground plane 58 are formed in first electrically conductive layer 46. At least one of first and second legs 156, 158 of second forked structures 74 may include an extension section overlying ground plane 58. In this example, first leg 156 includes an extension section 160 overlying first section 138 of ground plane 58 and second leg 158 includes an extension section 162 overlying second section 140 of ground plane 58. Extension section 160 and first section 138 of ground plane 58 are electrically interconnected by one or more conductive vias 164 extending through first dielectric material layer 60 (FIG. 2). Similarly, extension section 162 and second section 140 of ground plane 58 are electrically interconnected by one or more conductive vias 166 extending through first dielectric material layer 60. Thus, first and second sections 138, 140 of ground plane 58 and second forked structure 74 are electrically coupled by vias 164, 166. Alternative embodiments may include only one of extension sections 160, 162 and the corresponding conductive vias 164, 166.

Figure 8:
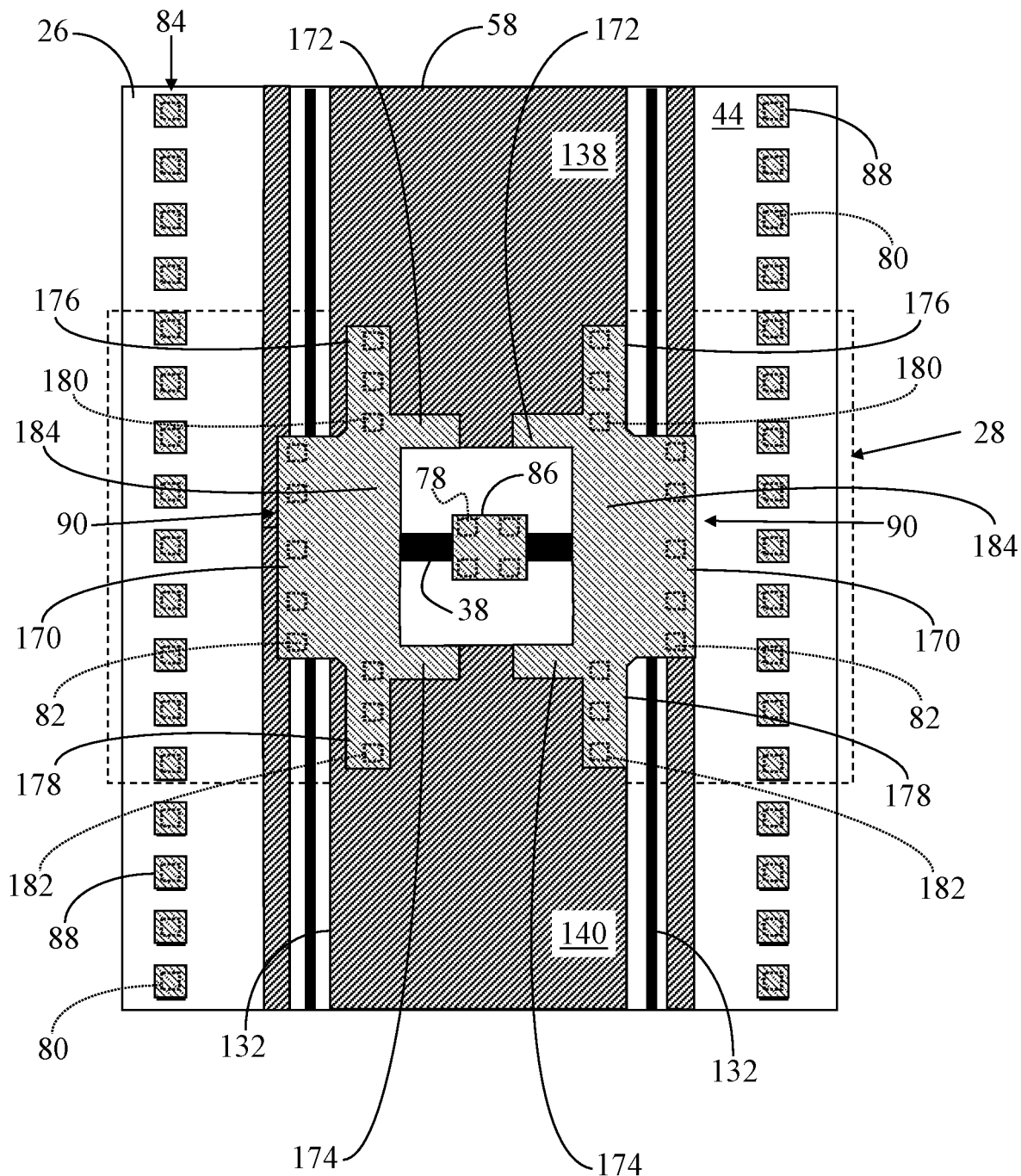
FIG. 8 shows a plan view of the portion of the transistor of FIG. 7 at a subsequent stage of processing to form the interconnect structure.

FIG. 8 shows a plan view of the portion of the transistor of FIG. 7 at a subsequent stage of processing to form interconnect structure 42 (FIG. 2). In this example, third conductive layer 84 (represented by light rightward and downward narrow hatching) has been formed on second dielectric material layer 76 (FIG. 2). For clarity, second dielectric material layer 76 is not shown in FIG. 8 in order to visualize the stacked relationship of structures within first, second, and third conductive layers 46, 68, 84. Again, an electrically conductive material such as a metal layer may be deposited, patterned, and etched to yield the desired structures (e.g., tap interconnect segments 86, drain segments 88, and third shield structure elements 90). Tap interconnect segments 86 may be coupled to the underlying tap interconnect segments 70 (FIG. 7) utilizing conductive vias 78, drain segments 88 may be coupled to the underlying drain segments 72 (FIG. 7) utilizing conductive vias 80, and third shield structure elements 90 may be coupled to the underlying second shield structure elements 74 (FIG. 7) utilizing conductive vias 82.

Third shield structure elements 90, formed in third conductive layer 84, include a base segment 170, a first leg 172, and a second leg 174 in which first and second legs 172, 174 extend from opposing ends of base segment 170 in a direction that is antiparallel to a length of base segment 170. That is, all of base segment 170, first leg 172, and second leg 174 yield a structure having an approximately U-shaped or forked geometry. Thus, third shield structure elements 90 may alternatively be referred to herein as third forked structures 90.

In general, base segments 154 of second forked structures 74 and base segments 170 of third forked structure 90 are electrically interconnected utilizing conductive vias 82. Further, base segment 154, first leg 156, and second leg 158 of second forked structure 74 (FIG. 7) are arranged in a stacked relationship with corresponding base segment 170, first leg 172, and second leg 174 of third forked structure 90 in a direction perpendicular to upper surface 44 of semiconductor substrate 26. As such, second and third forked structures 74, 90 (along with first forked structure 56, as discussed above) are generally vertically aligned relative to one another within interconnect structure 42 (FIG. 2) to yield reductions in electric coupling, while concurrently fitting within the size constraints of a compact transistor configuration.

In accordance with some embodiments, tap interconnect segment 86 formed in third conductive layer 84 of tap interconnect 114 (FIG. 2) resides between first and second legs 172, 174 of third forked structure 90. The position of tap interconnect segment 86 at least partially surrounded by first and second legs 172, 174 of second forked structure 74 may effectively insulate tap interconnect segment 86 to further reduce electric field coupling from drain runner 22 (FIG. 1) to tap interconnect segment 86.

At least one of first and second legs 172, 174 of third forked structures 90 may include an extension section overlying corresponding extension sections 160, 162 (FIG. 7) of second forked structures 74 (FIG. 7). In this example, first leg 172 includes an extension section 176 overlying extension section 160 of second forked structure 74 and second leg 174 includes an extension section 178 overlying extension section 162 of second forked structure 74. Extension sections 176, 160 are electrically interconnected by one or more conductive vias 180 extending through second dielectric material layer 76 (FIG. 2), and therefore extension section 176 is electrically connected to ground plane 58. Similarly, extension sections 178, 162 are electrically interconnected by one or more conductive vias 182 extending through second dielectric material layer 76, and therefore extension section 178 is also electrically connected to ground plane 58. Alternative embodiments may include only one of extension sections 176, 178 and the corresponding conductive vias 180, 182.

In accordance with some embodiments, each of third forked structures 90 further includes an extension portion, referred to herein as an extended roof 184, extending away from conductive vias 82 in base segment 170 and extending toward tap interconnect segment 86. This extended roof 184 may serve to reduce gate to drain capacitance, $C_{gd}$. An extended roof is absent from first and second shield structure elements 56 (FIG. 6), 74 (FIG. 7) because an extended roof at those locations closer to surface 44 of substrate 26 may adversely increase gate to source capacitance, $C_{gs}$. Thus, having extended roof 184 at a location further away from surface 44 of substrate (e.g., in third electrically conductive layer 84 rather than in first or second electrically conductive layers 46, 68 further reduces gate to drain capacitance while keeping gate to source capacitance to a minimum.

Figure 9:
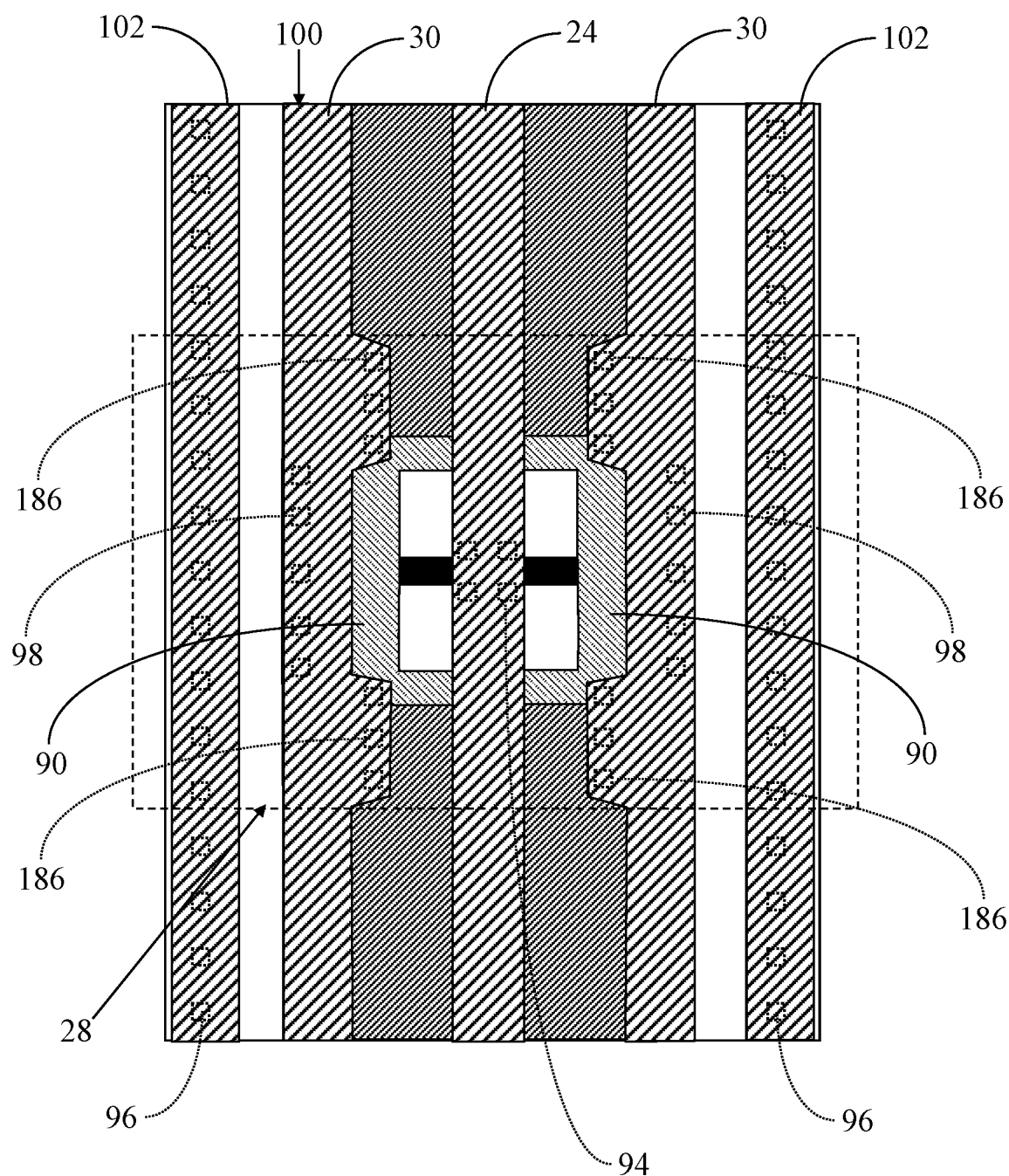
FIG. 9 shows a plan view of the portion of the transistor of FIG. 8 at a subsequent stage of processing to form the interconnect structure.

FIG. 9 shows a plan view of the portion of the transistor of FIG. 8 at a subsequent stage of processing to form interconnect structure 42 (FIG. 2). In this example, fourth conductive layer 100 (represented by rightward and upward wide hatching) has been formed on third dielectric material layer 92 (FIG. 2). For clarity, third dielectric material layer 92 is not shown in FIG. 9 in order to visualize the stacked relationship of structures within first, second, third, and fourth conductive layers 46, 68, 84, 100. Again, an electrically conductive material, such as a metal layer, may be deposited, patterned, and etched to yield the desired structures (e.g., gate runners 24, shield runners 30, and drain strips 102). Gate runners 24 may be coupled to the underlying tap interconnect segments 86 (FIG. 8) utilizing conductive vias 94, drain strips 102 may be coupled to the underlying drain segments 88 (FIG. 8) utilizing conductive vias 96, and shield runners 30 may be coupled to the underlying third shield structure elements 90 utilizing conductive vias 98 and additional conductive vias 186.

Figure 10:
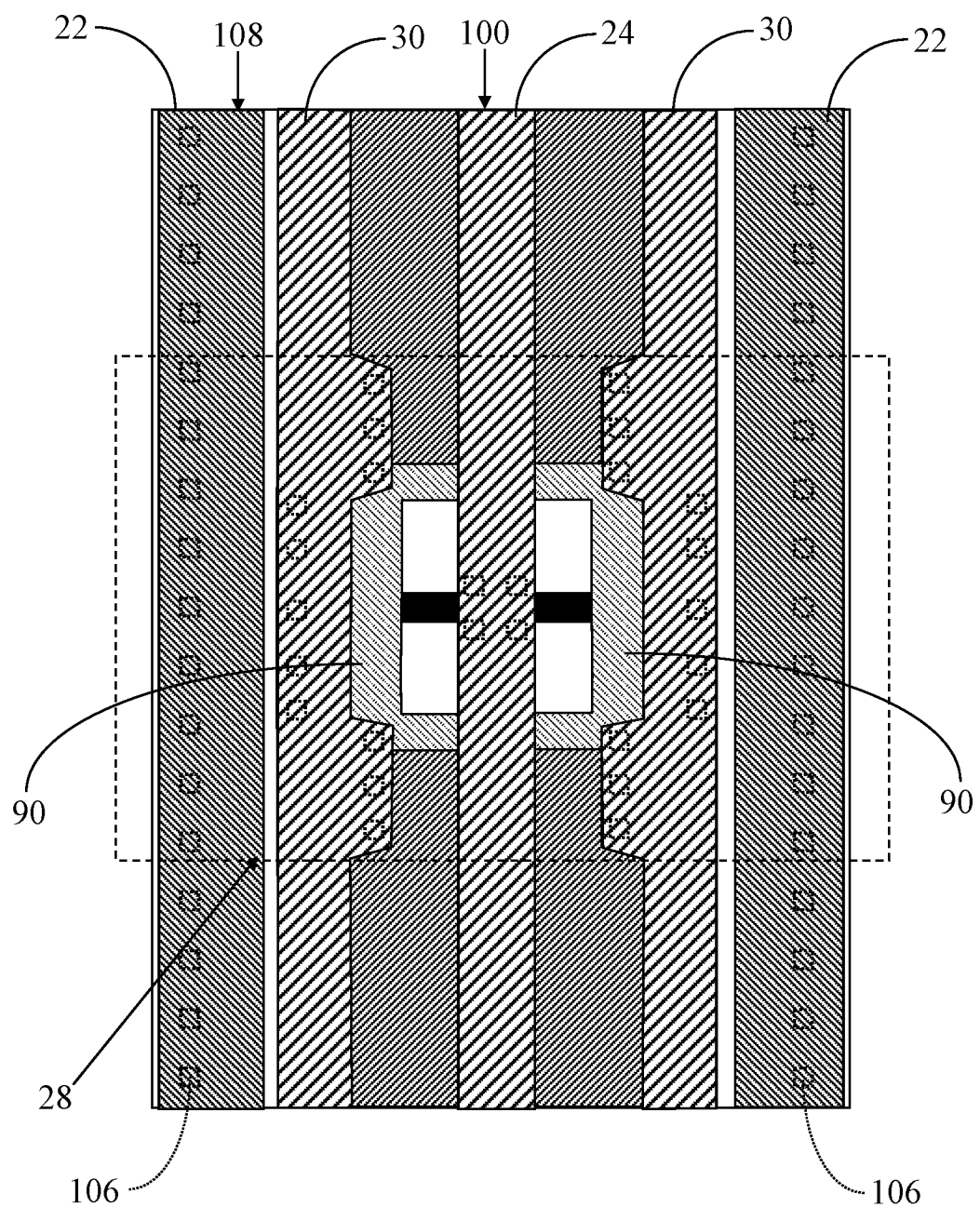
FIG. 10 shows a plan view of the portion of the transistor of FIG. 9 at a subsequent stage of processing to form the interconnect structure.

FIG. 10 shows a plan view of the portion of the transistor of FIG. 9 at a subsequent stage of processing to form interconnect structure 42 (FIG. 2). In this example, fifth conductive layer 108 (represented by dark rightward and downward narrow hatching) has been formed on fourth dielectric material layer 104 (FIG. 2). For clarity, fourth dielectric material layer 104 is not shown in FIG. 10 in order to visualize the stacked relationship of structures within first, second, third, fourth, and fifth conductive layers 46, 68, 84, 100, 108. Again, an electrically conductive material, such as a metal layer, may be deposited, patterned, and etched to yield the desired structures (e.g., drain runners 22). Drain runners 24 may be coupled to the underlying drain strips (FIG. 9) utilizing conductive vias 106.

Thus, gate and shield runners 24, 30 are formed in fourth conductive layer 100 and drain runners 22 in fifth conductive layer 108. In miniaturized transistors (e.g., having a pitch as low as 8.75 microns), conventional shielding in the topmost metal layer cannot be built due to space constraints. However, shielding may be achieved by implementing shield runners 30 in fourth conductive layer 100 instead of in fifth conductive layer 108.

In light of the discussion presented above in connection with FIGS. 6-10, methodology for manufacturing a transistor (e.g., transistor 20) entails providing semiconductor substrate (e.g., substrate 26) having a first terminal (e.g., drain region 36) and a second terminal (e.g., gate electrodes 38) and forming an interconnect structure (e.g., interconnect structure 42) on an upper surface (e.g., upper surface 44) of the semiconductor substrate of multiple layers of dielectric material (e.g. dielectric layers 60, 76, 92, 104, 110) and electrically conductive material (e.g., conductive layers 46, 68, 84, 100, 108). Forming the interconnect structure includes forming a first pillar (e.g., drain pillars 112) from the electrically conductive material, the first pillar contacting the first terminal, forming a second (e.g., tap interconnects 114) from the electrically conductive material, the second pillar electrically contacting the second terminal, and forming a shield system (e.g., shield system 32) between the first and second pillars, the shield system including a first forked structure (e.g., first shield structure elements 56) formed in a first conductive layer (e.g., first conductive layer 46) of the electrically conductive material and at least partially surrounding a first segment (e.g., tap interconnect segment 48) of the second pillar, a second forked structure (e.g., second shield structure elements 74) formed in a second conductive layer (e.g., second conductive layer 68) of the electrically conductive material. The second forked structure overlies the first forked structure and at least partially surrounds a second segment (e.g., tap interconnect segment 70) of the second pillar. The first and second forked structures are electrically interconnected by vias 66 extending through a first dielectric layer (e.g., first dielectric layer 60) of the dielectric material formed between the first and second conductive layers.

Accordingly, an embodiment described above includes a number of features that may collectively reduce electric coupling between the gate and drain of a transistor. These features include the vertically aligned stacked configuration of first forked structure 56 (FIG. 6), conductive vias 66 (FIG. 7), second forked structure 74 (FIG. 7), conductive vias 82 (FIG. 8), and third forked structure 90 (FIG. 8) of shield system 32 (FIG. 1) that effectively forms a cage or barrier between tap interconnects 114 (FIG. 2) and drain pillars 112 (FIG. 2) at tap locations 28 to reduce gate to drain coupling, and therefore reduce the feedback capacitance, Co, and improve gain. Further, the absence of these structures outside of tap locations 28 may enable the gate to source capacitance, $C_gs$, to be kept to a minimum. These features may additionally include the presence of shield traces 136 (FIG. 6) in first conductive layer 46 (FIG. 6) outside of tap locations 28 and longitudinally aligned with gate fingers 132 that may function to further reduce the feedback capacitance and thus improve gain. Still further, the features may additionally include forming shield runners 30 in a metal layer just below the top metal layer to accommodate the tight pitch constraints of miniaturized transistors. Such a structural configuration may enable a compact transistor configuration and highly integrated system design. Further, the geometry of the shield structure may effectively increase the gain of the active device (e.g., transistor) without degrading stability by reducing electric coupling.

The configuration described above includes all three of the previously discussed features for reducing electric coupling between gate structures and drain structures, between gate structures and shield structures, and between drain structures and shield structures. However, alternative embodiments may be configured to have less than the three features. Further, it bears repeating that a configuration may include more or less than the five electrically conductive layers discussed herein. Still further, although the multiple shielding features may be implemented on miniaturized transistors having an extremely tight pitch, it should be understood that the multilayer stacked shielding may be useful on wider pitch devices. As such, the shield runners and/or the gate runners may be formed in the same electrically conductive layer as the drain runners on wider pitch devices.

Transistor 20 may be a primary active component of a Doherty power amplifier having one carrier amplifier and one peaking amplifier, as known to those skilled in the art. However, it should be understood, based on the description herein, that embodiments of the inventive subject matter may be used in conjunction with virtually any type of multiple path amplifier. Accordingly, the transistor having the shield structures described herein is not limited to use with Doherty amplifiers, but may alternatively be implemented within a wide variety of circuits.

Accordingly, embodiments disclosed herein entail a transistor in a compact form factor having a shield system that includes multilayer shield structures within an interconnect structure of the transistor. More specifically, embodiments can include multiple shield structures strategically located along the runners of a multiple runner interdigitated transistor near positions where the input interconnections approach the output interconnections (tap locations). Each shield structure includes two or more stacked structures, each having an approximately U-shaped or forked geometry, that are formed in at least two layers of electrically conductive material. The stacked structures are interconnected by electrically conductive vias, and connect to overlying shield runners by electrically conductive vias. The shield runners and gate runners of the transistor may be positioned in an electrically conductive layer below a topmost electrically conductive layer of the interconnect structure and the drain runners may be positioned in the topmost electrically conductive layer for a tight pitch transistor. Additionally, the shield system can include shield traces that are positioned between the gate fingers and the drain of the transistor. The shield traces may be longitudinally aligned with the length of the gate fingers. The geometry of the shield system may enable a reduction in electric coupling between the gate and drain features of the transducer to effectively increase the gain of the active device (e.g., transistor) without degrading device stability. Further, the geometry of the stacked shield structures and their location at the tap locations can enable a compact and highly integrated system design.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A transistor comprising:
   a semiconductor substrate having a first terminal and a second terminal; and
   an interconnect structure on an upper surface of the semiconductor substrate, the interconnect structure being formed of multiple layers of dielectric material and electrically conductive material, the electrically conductive material of the interconnect structure comprising:
      a first pillar in electrical contact with the first terminal;
      a second pillar in electrical contact with the second terminal; and
      a shield system positioned between the first and second pillars, the shield system including a first forked structure formed in a first conductive layer of the electrically conductive material and at least partially surrounding a first segment of the second pillar, a second forked structure formed in a second conductive layer of the electrically conductive material overlying the first forked structure and at least partially surrounding a second segment of the second pillar, the first and second forked structures being electrically interconnected by a first conductive via extending through a first dielectric layer of the dielectric material formed between the first and second conductive layers.

2. The transistor of claim 1 wherein each of the first and second forked structures comprises:
   a base segment;
   a first leg; and
   a second leg, the first and second legs extending from opposing ends of the base segment in a direction that is antiparallel to a length of the base segment, wherein the base segment, first leg, and second leg of each of the first and second forked structures are arranged in a stacked relationship in a direction perpendicular to the upper surface of the semiconductor substrate.

3. The transistor of claim 2 wherein the first conductive via extends between the base segment of each of the first and second forked structures.

4. The transistor of 3 wherein the base segment of each of the first and second forked structures and the first conductive via reside between the first and second pillars.

5. The transistor of claim 2 wherein:
   the interconnect structure further includes a ground plane formed in the first conductive layer; and
   at least one of the first and second legs of the second forked structure includes an extension section overlying the ground plane, the extension section and the ground plane being electrically interconnected by a second conductive via extending through the first dielectric layer.

6. The transistor of claim 1 wherein the interconnect structure further includes a third forked structure formed in a third conductive layer of the electrically conductive material overlying the second forked structure and at least partially surrounding a third segment of the second pillar, the second and third forked structures being electrically interconnected by a second conductive via extending through a second dielectric layer of the dielectric material formed between the second and third conductive layers.

7. The transistor of claim 6 wherein:
   each of the first, second, and third forked structures comprises a base segment, a first leg, and a second leg, the first and second legs extending from opposing ends of the base segment in a direction that is antiparallel to a length of the base segment, wherein the base segment, first leg, and second leg of each of the first, second, and third forked structures are arranged in a stacked relationship in a direction perpendicular to the upper surface of the semiconductor substrate;
   the third conductive layer resides farthest away from the upper surface of the semiconductor substrate relative to the first and second conductive layers; and
   the base section of the third forked structure includes an extension portion, the extension portion being positioned closer to the third segment of the second pillar than the base section of each of the first and second forked structures to the corresponding first and second segments of the second pillar.

8. The transistor of claim 1 further comprising:
   a first runner formed in a top conductive layer of the electrically conductive material and electrically connected to the first pillar, the top conductive layer residing farthest away from the upper surface of the semiconductor substrate relative to remaining conductive layers of the electrically conductive material;
   a second runner electrically connected to the second pillar; and
   a third runner interposed between the first and second runners, the third runner being electrically connected to the shield system, wherein the second and third runners are formed in a next conductive layer of the electrically conductive material, the next conductive layer underlies the top conductive layer, and another dielectric layer extends between the top and the next conductive layers.

9. The transistor of claim 8 wherein:
   the first pillar forms a portion of an output from the first terminal;
   the first runner is an output runner;

the second pillar forms a portion of an input to the second terminal;
the second runner is an input runner; and
the third runner is a shield runner.

10. The transistor of claim 1 wherein:
the transistor further comprises a gate region, the gate region including a first gate finger characterized by a length;
the interconnect structure further includes a plurality of first pillars aligned with the length of the first gate finger; and
the shield system further includes a first shield trace formed in the first conductive layer, the first shield trace being longitudinally aligned with the length of the first gate finger and positioned between the first gate finger and a first side of the plurality of first pillars, wherein the first conductive layer resides closest to the upper surface of the semiconductor substrate relative to the second conductive layer.

11. The transistor of claim 10 wherein:
the gate region further includes a second gate finger characterized by the length; and
the shield system further includes a second shield trace formed in the first conductive layer and longitudinally aligned with the length of the second gate finger, the second shield trace being positioned between the second gate finger and a second side of the plurality of pillars.

12. The transistor of claim 10 wherein the interconnect structure further includes a ground plane formed in the first conductive layer, and the first shield trace is electrically connected to the ground plane.

13. A method of manufacturing a transistor comprising:
providing a semiconductor substrate having a first terminal and a second terminal; and
forming an interconnect structure on an upper surface of the semiconductor substrate of multiple layers of dielectric material and electrically conductive material, the forming the interconnect structure comprising:
forming a first pillar from the electrically conductive material, the first pillar electrically contacting the first terminal;
forming a second pillar from the electrically conductive material, the second pillar electrically contacting the second terminal; and
forming a shield system between the first and second pillars, the shield system including a first forked structure formed in a first conductive layer of the electrically conductive material and partially at least surrounding a first segment of the second pillar, a second forked structure formed in a second conductive layer of the electrically conductive material overlying the first forked structure and at least partially surrounding a second segment of the second pillar, the first and second forked structures being electrically interconnected by a first conductive via extending through a first dielectric layer of the dielectric material formed between the first and second conductive layers.

14. A transistor comprising:
a semiconductor substrate having a first terminal and a second terminal; and
an interconnect structure on an upper surface of the semiconductor substrate, the interconnect structure being formed of multiple layers of dielectric material and electrically conductive material, the electrically conductive material of the interconnect structure comprising:
a first pillar in electrical contact with the first terminal;
a second pillar in electrical contact with the second terminal; and
a shield system positioned between the first and second pillars, the shield system including a first forked structure formed in a first conductive layer of the electrically conductive material and at least partially surrounding a first segment of the second pillar, a second forked structure formed in a second conductive layer of the electrically conductive material overlying the first forked structure and at least partially surrounding a second segment of the second pillar, the first and second forked structures being electrically interconnected by a first conductive via extending through a first dielectric layer of the dielectric material formed between the first and second conductive layers, wherein each of the first and second forked structures includes a base segment, a first leg, and a second leg, the first and second legs extending from opposing ends of the base segment in a direction that is antiparallel to a length of the base segment, wherein the base segment, first leg, and second leg of each of the first and second forked structures are arranged in a stacked relationship in a direction perpendicular to the upper surface of the semiconductor substrate;
a first runner formed in a top conductive layer of the electrically conductive material and electrically connected to the first pillar, the top conductive layer residing farthest away from the upper surface of the semiconductor substrate relative to remaining conductive layers of the electrically conductive material;
a second runner electrically connected to the second pillar; and
a third runner interposed between the first and second runners, the third runner being electrically connected to the shield system, wherein the second and third runners are formed in a next conductive layer of the electrically conductive material, the next conductive layer underlies the top conductive layer, and another dielectric layer extends between the top and the next conductive layers.

15. The transistor of claim 14 wherein the first conductive via extends between the base segment of each of the first and second forked structures, and the base segment of each of the first and second forked structures and the first conductive via reside between the first and second pillars.

16. The transistor of claim 14 wherein:
the interconnect structure further includes a ground plane formed in the first conductive layer; and
at least one of the first and second legs of the second forked structure includes an extension section overlying the ground plane, the extension section and the ground plane being electrically interconnected by a second conductive via extending through the first dielectric layer.

17. The transistor of claim 14 wherein the interconnect structure further includes a third forked structure formed in a third conductive layer of the electrically conductive material overlying the second forked structure and at least partially surrounding a third segment of the second pillar, the second and third forked structures being electrically interconnected by a second conductive via extending through a second dielectric layer of the dielectric material formed between the second and third conductive layers.

18. The transistor of claim 17 wherein:

each of the first, second, and third forked structures comprises a base segment, a first leg, and a second leg, the first and second legs extending from opposing ends of the base segment in a direction that is antiparallel to a length of the base segment, wherein the base segment, first leg, and second leg of each of the first, second, and third forked structures are arranged in a stacked relationship in a direction perpendicular to the upper surface of the semiconductor substrate;

the third conductive layer resides farthest away from the upper surface of the semiconductor substrate relative to the first and second conductive layers; and the base section of the third forked structure includes an extension portion, the extension portion being positioned closer to the third segment of the second pillar than the base section of each of the first and second forked structures to the corresponding first and second segments of the second pillar.

19. The transistor of claim 14 wherein:

the transistor further comprises a gate region, the gate region including first and second gate fingers characterized by a length;

the interconnect structure further includes a plurality of first pillars aligned with the length of the first gate finger; and the shield system further includes:

a first shield trace formed in the first conductive layer, the first shield trace being longitudinally aligned with the length of the first gate finger and positioned between the first gate finger and a first side of the plurality of first pillars; and a second shield trace formed in the first conductive layer and longitudinally aligned with the length of the second gate finger, the second shield trace being positioned between the second gate finger and a second side of the plurality of first pillars, wherein the first conductive layer resides closes to the upper surface of the semiconductor substrate relative to the second conductive layer.

20. The transistor of claim 19 wherein the interconnect structure further includes a ground plane formed in the first conductive layer, and the first shield trace is electrically connected to the ground plane.

\* \* \* \* \*